United States Patent
Kim et al.

(10) Patent No.: US 10,051,265 B2
(45) Date of Patent: Aug. 14, 2018

(54) LOGIC DEVICES, DIGITAL FILTERS AND VIDEO CODECS INCLUDING LOGIC DEVICES, AND METHODS OF CONTROLLING LOGIC DEVICES

(71) Applicant: Samsung Electronics Co., Ltd., Suwon-Si, Gyeonggi-Do (KR)

(72) Inventors: Ho-jung Kim, Suwon-si (KR); U-in Chung, Seoul (KR); Hyun-sik Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 619 days.

(21) Appl. No.: 13/963,015

(22) Filed: Aug. 9, 2013

(65) Prior Publication Data
US 2014/0140397 A1    May 22, 2014

(30) Foreign Application Priority Data

Nov. 19, 2012  (KR) .................. 10-2012-0131110

(51) Int. Cl.
*H04N 7/12*    (2006.01)
*H04N 11/02*   (2006.01)
(Continued)

(52) U.S. Cl.
CPC ....... *H04N 19/00763* (2013.01); *G11C 11/41* (2013.01); *G11C 14/009* (2013.01);
(Continued)

(58) Field of Classification Search
CPC ..... G11C 11/41; G11C 14/009; G11C 29/028; H03K 19/17748; H03K 19/17776; H03K 19/17772; H04N 19/00763
(Continued)

(56) References Cited

U.S. PATENT DOCUMENTS 5,646,545 A * 7/1997 Trimberger ......... G06F 15/7867
                                              326/38
6,542,000 B1   4/2003 Black et al.
(Continued)

FOREIGN PATENT DOCUMENTS

CN   1512513 A    7/2004
CN   101189797 A  5/2008
(Continued)

OTHER PUBLICATIONS

Extended European Search Report dated Mar. 14, 2014 issued in corresponding European Application No. 13189567.4.
(Continued)

*Primary Examiner* — Jorge L Ortiz Criado
*Assistant Examiner* — Boubacar Abdou Tchoussou
(74) *Attorney, Agent, or Firm* — Harness, Dickey & Pierce, PLC

(57) ABSTRACT

A logic device includes: a function block and a configuration block. The function block is configurable to perform operations associated with a plurality of operation modes. The configuration block is configured to configure the function block to perform an operation associated with any one of the plurality of operation modes. The logic device also includes a controller configured to control the configuration block so that the function block is configured to perform the operation.

17 Claims, 8 Drawing Sheets

(51) Int. Cl.
    *H04N 11/04*    (2006.01)
    *H04N 19/593*   (2014.01)
    *G11C 14/00*    (2006.01)
    *H03K 19/177*   (2006.01)
    *G11C 11/41*    (2006.01)
    *G11C 29/02*    (2006.01)

(52) U.S. Cl.
    CPC ..... *G11C 29/028* (2013.01); *H03K 19/17748* (2013.01); *H03K 19/17772* (2013.01); *H03K 19/17776* (2013.01)

(58) Field of Classification Search
    USPC .......................................... 375/240.12; 326/38
    See application file for complete search history.

(56) References Cited

U.S. PATENT DOCUMENTS

| | | | | |
|---|---|---|---|---|
| 6,978,048 | B1* | 12/2005 | Higginbottom | ........ H04N 19/63 375/240.19 |
| 7,386,049 | B2* | 6/2008 | Garrido | ................ H04N 7/0125 348/699 |
| 2002/0035650 | A1 | 3/2002 | Nakamoto et al. | |
| 2003/0195910 | A1 | 10/2003 | Corless et al. | |
| 2004/0125660 | A1* | 7/2004 | Ooishi | .................... G11C 11/16 365/189.05 |
| 2005/0108507 | A1 | 5/2005 | Chheda et al. | |
| 2005/0246520 | A1* | 11/2005 | Vadi | ................ H03K 19/17744 713/100 |
| 2006/0007755 | A1 | 1/2006 | Ooishi | |
| 2007/0046781 | A1 | 3/2007 | Ramos et al. | |
| 2007/0283311 | A1* | 12/2007 | Karoubalis | ......... G06F 17/5054 326/38 |
| 2008/0112470 | A1 | 5/2008 | Cleveland et al. | |
| 2009/0031106 | A1* | 1/2009 | Honda | ............. H03K 19/17728 712/29 |
| 2009/0135035 | A1 | 5/2009 | Fifield | |
| 2010/0066408 | A1* | 3/2010 | Kyouno | ........... H03K 19/17748 326/38 |
| 2011/0026719 | A1 | 2/2011 | Barnhill | |
| 2011/0133778 | A1 | 6/2011 | Kim et al. | |
| 2011/0228595 | A1 | 9/2011 | Rao et al. | |
| 2012/0110051 | A1 | 5/2012 | Mathai et al. | |
| 2012/0117371 | A1* | 5/2012 | Murzeau | ............. G06F 15/7871 713/100 |
| 2013/0039119 | A1 | 2/2013 | Rao et al. | |

FOREIGN PATENT DOCUMENTS

| | | |
|---|---|---|
| CN | 102486867 A | 6/2012 |
| CN | 102550026 A | 7/2012 |
| KR | 19990077702 | 10/1999 |
| KR | 20030045017 | 6/2003 |
| KR | 20110098554 A | 9/2011 |

OTHER PUBLICATIONS

Chinese Office Action dated Mar. 23, 2017 issued in corresponding Chinese Application No. 201310390990.1 (with translation).

* cited by examiner

LOGIC DEVICES, DIGITAL FILTERS AND VIDEO CODECS INCLUDING LOGIC DEVICES, AND METHODS OF CONTROLLING LOGIC DEVICES

CROSS-REFERENCE TO RELATED APPLICATIONS

This application claims priority under 35 U.S.C. § 119 to Korean Patent Application No. 10-2012-0131110, filed on Nov. 19, 2012, in the Korean Intellectual Property Office, the disclosure of which is incorporated herein in its entirety by reference.

BACKGROUND

Field

Example embodiments relate to logic devices, digital filters and video codecs including logic devices, methods of operating controllers and methods of controlling logic devices.

Description of the Related Art

Use of logic devices capable of being arbitrarily configured by users has increased. As such, users may control the connection between signal lines included in logic devices to configure or re-configure the logic devices to implement different functions.

Also, logic devices may be initially configured or re-configured later to perform a plurality of functions as desired. Logic devices may be implemented in the form of programmable logic devices (PLDs).

SUMMARY

Example embodiments provide logic devices that may be configured more effectively.

Example embodiments also provide digital filters and video codecs including logic devices.

Example embodiments also provide methods of operating controllers and methods of controlling logic devices.

Example embodiments also provide non-transitory computer readable recording media having recorded thereon programs that when executed by a computing device cause the computing device to execute the methods.

Additional aspects will be set forth in part in the description which follows and, in part, will be apparent from the description, or may be learned by practice of example embodiments.

According to at least one example embodiment, a logic device includes: a function block configurable to perform operations associated with a plurality of operation modes; a configuration block including at least one nonvolatile storage device configured to store configurable data for configuring the function block to perform an operation associated with any one of the plurality of operation modes; and a controller configured to control the configuration block to configure the function block to perform the operation associated with any one of the plurality of operation modes.

At least one other example embodiment provides a digital filter including a logic device. The logic device includes: a function block configurable to perform operations associated with a plurality of operation modes; a configuration block including at least one nonvolatile storage device configured to store configurable data for configuring the function block to perform an operation associated with any one of the plurality of operation modes; and a controller configured to control the function block to perform the operation associated with any one of the plurality of operation modes. In at least this example embodiment, the logic device is configurable to perform operations associated with a plurality of operation modes according to or associated with a filter function.

At least one other example embodiment provides a video codec configured to perform an encoding operation. According to at least this example embodiment, the video codec includes: an intra predictor configured to perform a prediction operation using a digital filter that is configured to perform operations associated with a plurality of operation modes corresponding to a plurality of arithmetic operations based on an intra prediction mode. The digital filter is configured to perform the operations associated with the plurality of operation modes using a plurality of logic devices. Each of the logic devices includes: a function block configurable to perform the operations associated with the plurality of operation modes; a configuration block including at least one nonvolatile storage device configured to store configurable data for configuring the function block to perform an operation associated with any one of the plurality of operation modes; and a controller configured to control the configuration block to configure the function block.

At least one other example embodiment provides a method of controlling a logic device that is configurable to perform operations corresponding to a plurality of operation modes. According to at least this example embodiment, the method includes: configuring the logic device to perform a first operation associated with a first operation mode from among a plurality of operation modes; and reconfiguring the logic device to perform a second operation associated with a second operation mode from among the plurality of operation modes by using configurable data loaded from a nonvolatile memory in the logic device while the logic device performs the first operation.

At least one other example embodiment provides a non-transitory computer readable recording medium having recorded thereon a program that, when executed on a computing device, causes the computing device to execute a method of controlling a logic device that is configurable to perform operations associated with a plurality of operation modes. According to at least this example embodiment, the method includes: configuring the logic device to perform a first operation associated with a first operation mode from among a plurality of operation modes; and reconfiguring the logic device to perform a second operation associated with a second operation mode from among the plurality of operation modes by using configurable data loaded from a nonvolatile memory in the logic device while the logic device performs the first operation.

At least one other example embodiment provides a logic device including: a function block configurable to perform a first operation associated with a first operation mode from among a plurality of operation modes; and a configuration block including at least a first nonvolatile storage device for storing first configuration data to configure the function block to perform the first operation associated with the first operation mode.

According to at least some example embodiments, the logic device may further include: a controller configured to control the configuration block to configure the function block to perform the first operation associated with the first operation mode.

The configuration block may further include: a latch configured to output, to the function block, the first configuration data stored in the first nonvolatile storage device.

The logic device may further include: a first nonvolatile memory configured to store the first configuration data. The configuration block is configured to load the first configuration data from the first nonvolatile memory, and to write the first configuration data from the first nonvolatile memory to the first nonvolatile storage device.

The configuration block may further include a second nonvolatile storage device, and the configuration block may be further configured to write second configuration data corresponding to a second of the plurality of operation modes to the second nonvolatile storage device. The configuration block may be further configured to write the second configuration data to the second nonvolatile storage device while the function block performs the first operation.

The configuration block may be further configured to write the second configuration data to the second nonvolatile storage device while the function block is being configured to perform the first operation.

The configuration block may be further configured to write the second configuration data to the second nonvolatile storage device between a time when the first configuration data read from the first nonvolatile storage device of the configuration block is output to the function block and a time when the function block completes the first operation.

The configuration block may be configured to write data to at least one of the first and second nonvolatile storage devices in response to a switching control signal output from the controller. The controller may be configured to output the switching control signal with reference to a control signal indicative of activation or deactivation of the first or second nonvolatile storage device.

The control signal indicative of activation or deactivation of the first or second nonvolatile storage device may control a switching operation of a switching device connected to the first or second nonvolatile storage device.

The configuration block may include a plurality of nonvolatile storage devices, and the configuration block may be configured to configure the function block based on configuration data stored in each of the plurality of nonvolatile storage devices. Each of the plurality of nonvolatile storage devices may correspond to an operation mode among the plurality of operation modes.

At least one other example embodiment provides a digital filter. The digital filter includes a logic device. The logic device includes: a function block configurable to perform a first operation associated with a first operation mode from among a plurality of operation modes; and a configuration block including at least a first nonvolatile storage device for storing first configuration data to configure the function block to perform the first operation associated with the first operation mode. In at least this example embodiment, the plurality of operation modes are associated with a filter function.

According to at least some example embodiments, the digital filter may include a plurality of shifters. At least one of the plurality of shifters may include a logic device that is configurable to shift a data word by a first bit number corresponding to each of the plurality of operation modes.

At least one other example embodiment provides a format conversion filter configured to convert a format of input data using a digital filter. The digital filter includes a logic device. The logic device includes: a function block configurable to perform a first operation associated with a first operation mode from among a plurality of operation modes; and a configuration block including at least a first nonvolatile storage device for storing first configuration data to configure the function block to perform the first operation associated with the first operation mode. In at least this example embodiment, the plurality of operation modes are associated with a filter function.

At least one other example embodiment provides a video codec for performing an encoding operation. The video codec includes: an intra predictor configured to perform a prediction operation by using a digital filter that is configurable to perform operations based on a plurality of operation modes corresponding to a plurality of arithmetic operations associated with an intra prediction mode. The digital filter is configurable to perform operations associated with the plurality of operation modes using a plurality of logic devices. Each of the logic devices includes: a function block that is configurable to perform the operations associated with the plurality of operation modes; and a configuration block including at least one nonvolatile storage device configured to store configurable data for configuring the function block to perform an operation associated with an operation mode among the plurality of operation modes.

At least one other example embodiment provides a logic device including: a configuration block including at least a first nonvolatile storage device, the configuration block being configured to store, in the first nonvolatile storage device, first configuration data, the configuration block being further configured to configure the logic device to perform a first operation associated with a first operation mode from among a plurality of operation modes based on the first configuration data stored in the first nonvolatile storage device.

According to at least some example embodiments, the logic device may further include a controller configured to control the configuration block to configure the logic device to perform the first operation. The logic device may further include a function block configured to perform the first operation associated with the first operation mode.

The configuration block may be configured to configure the function block to perform the first operation based on the first configuration data stored in the first nonvolatile storage device.

The configuration block may include a second nonvolatile storage device, and the configuration block may be further configured to store, in the second nonvolatile storage device, second configuration data corresponding to a second operation mode from among the plurality of operation modes. The configuration block may be configured to configure the logic device to perform a second operation associated with the second operation mode based on the second configuration data. The configuration block may be configured to read the second configuration data from a first nonvolatile memory and store the second configuration data in the second nonvolatile memory device while the logic device is being configured to perform or performs the first operation.

As described above, logic devices may be configured and/or reconfigured more efficiently to perform a given, desired or predetermined operations via nonvolatile memory devices.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
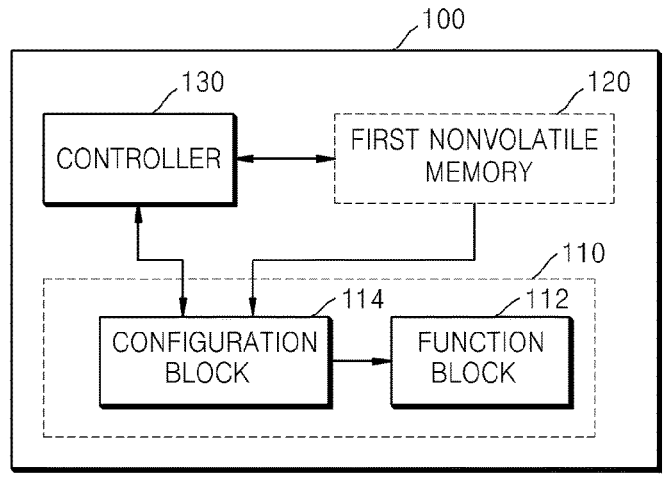
FIG. 1 is a block diagram of a logic device according to an example embodiment.

Inventive concepts will now be described more fully hereinafter with reference to the accompanying drawings, in which some example embodiments of inventive concepts are shown. However, the inventive concepts may be embodied in many different forms and should not be construed as limited to the embodiments set forth herein. Rather, these example embodiments are provided so that this disclosure will be thorough and complete, and will fully convey the scope of inventive concepts to those skilled in the art.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

When an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Specific details are provided in the following description to provide a thorough understanding of example embodiments. However, it will be understood by one of ordinary skill in the art that example embodiments may be practiced without these specific details. For example, systems may be shown in block diagrams in order not to obscure the example embodiments in unnecessary detail. In other instances, well-known processes, structures and techniques may be shown without unnecessary detail in order to avoid obscuring example embodiments.

Also, it is noted that example embodiments may be described as a process depicted as a flowchart, a flow diagram, a data flow diagram, a structure diagram, or a block diagram. Although a flowchart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, a function, a procedure, a subroutine, a subprogram, etc. When a process corresponds to a function, its termination may correspond to a return of the function to the calling function or the main function.

Moreover, as disclosed herein, the term "buffer," "memory" or the like, may represent one or more devices for storing data, including random access memory (RAM), magnetic RAM, core memory, and/or other machine readable mediums for storing information. The term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "computer-readable medium" may include, but is not limited to, portable or fixed storage devices, optical storage devices, and various other mediums capable of storing or containing instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a storage medium. A processor(s) may perform the necessary tasks.

A code segment may represent a procedure, a function, a subprogram, a program, a routine, a subroutine, a module, a software package, a class, or any combination of instructions, data structures, or program statements.

Expressions such as "at least one of," when preceding a list of elements, modify the entire list of elements and do not modify the individual elements of the list.

FIG. 1 is a block diagram of a logic device 100 according to an example embodiment.

Referring to FIG. 1, the logic device 100 includes a logic block 110, a first nonvolatile memory 120, and a controller 130. The logic block 110 includes a function block 112 and a configuration block 114.

FIG. 1 illustrates only components related to this example embodiment of the logic device 100. Accordingly, it will be understood by those of ordinary skill in the art that other general purpose components other than those illustrated in FIG. 1 may be further included in the logic device 100.

The logic device 100 may be configured to perform one or more functions from among a plurality of functions. In this case, the plurality of functions include operations corresponding to a plurality of operation modes. The logic device 100 may be configured or reconfigured to perform any one of various given, desired or predetermined operations. For example, the logic device 100 may be configured to perform a first operation corresponding to a first operation mode from among the plurality of operation modes. In addition, the logic device 100 may be reconfigured to perform a second operation corresponding to a second operation mode from among the plurality of operation modes. The first and second operations may be different logic operations. The terms "configuration/configured" and "reconfiguration/reconfigured" may be used interchangeably.

The plurality of functions and the plurality of operation modes that correspond to each of the plurality of functions may be set by a user. In more detail, the logic device 100 may be configured or reconfigured so that the logic device 100 is able to perform operations corresponding to a plurality of operation modes according to functionality desired by a user.

The plurality of operation modes may be determined according to an implementation of the logic device 100 (e.g., an environment where the logic device 100 is used). For example, if the logic device 100 is defined or configured to perform a function corresponding to an MPEG-4 format conversion filter, then the plurality of operation modes may include various video format conversion modes. As another example, if the logic device 100 is defined to perform a function corresponding to an H.264 video codec, then the plurality of operation modes may include various calculations according to a prediction mode of intra prediction.

According to at least some example embodiments, the logic device 100 may be a programmable logic device (PLD), a field programmable gate array (FPGA), a programmable array logic (PAL), a programmable logic array (PLA), a generic array logic (GAL), or the like. However, example embodiments are not limited to these examples.

As mentioned above, the logic block 110 includes the function block 112 and the configuration block 114. The function block 112 may be configured to perform operations corresponding to a plurality of operation modes. The configuration block 114 configures the function block 112 to perform the operations according to the plurality of operation modes.

In one example, the function block may be configured to perform a shifter function. In this example, the function block 112 is configured to shift a data word by a given, desired or predetermined bit number corresponding to the plurality of operation modes.

The configuration block 114 includes one or more (e.g., at least one or a plurality of) nonvolatile storage devices (not shown) for storing configurable data (also referred to herein as configuration data) for configuring the function block 112 to perform an operation corresponding to one of a plurality of operation modes. In addition, the configuration block 114 may include a latch for outputting configurable data written in the nonvolatile storage device or a plurality of nonvolatile storage devices to the function block 112.

According to at least one example embodiment, the configuration block 114 may have an overlay configuration type or a multi configuration type.

The overlay configuration type refers to a case in which configurable data is stored in the first nonvolatile memory 120, and if necessary, the configuration block 114 reads the configurable data stored in the first nonvolatile memory 120, writes the read configurable data to a nonvolatile storage device, and configures the function block 112 using or based on the written configurable data.

The multi configuration type refers to a case where configurable data is previously written (e.g., stored in advance) to a nonvolatile storage device of the configuration block 114, and if necessary, the configuration block 114 configures the function block 112 based on the configurable data stored in the nonvolatile storage device.

If the configuration block 114 is implemented as an overlay configuration type, then the configuration block 114 configures the function block 112 based on configurable data stored in the first nonvolatile memory 120 so that an operation corresponding to any one of a plurality of operation modes may be performed by the function block 112. For example, if the plurality of operation modes include first through fourth operation modes, then the configuration block 114 may configure the function block 112 to perform an operation corresponding to any one of the first through fourth operation modes. In this case, configurable data for configuring the function block 112 to perform each of the first through fourth operation modes may be loaded into the configuration block 114 from the first nonvolatile memory 120.

The configuration block 114 may include one or more (e.g., at least one or a plurality of) nonvolatile storage devices for storing configurable data that is loaded from the first nonvolatile memory 120. In more detail, for example, the configuration block 114 may be a latch including one or more nonvolatile storage devices. However, example embodiments are not limited to this example. Although a case where the configuration block 114 includes at least two nonvolatile storage devices is discussed below as an example, example embodiments are not limited thereto.

According to at least some example embodiments, the configuration block 114 may write configurable data from the first nonvolatile memory 120 to any one of the nonvolatile storage devices when configuring the function block 112.

To configure the function block 112 to operate in the first operation mode from among the plurality of operation modes, the configuration block 114 writes first configurable data corresponding to the first operation mode. In this example, the first configurable data is loaded from the first nonvolatile memory 120 to any one of the at least two nonvolatile storage devices in the configuration block 114.

In one example, if the configuration block 114 includes a first nonvolatile storage device and a second nonvolatile storage device and first configurable data corresponding to a first operation mode is written to the first nonvolatile storage device, then the configuration block 114 reads the first configurable data stored in the first nonvolatile storage device and configures the function block 112 to perform the first operation based on or according to the first configurable data. Thus, the function block 112 is configured to perform the first operation, which corresponds to the first operation mode, based on the first configurable data. At the same time (e.g., simultaneously and/or concurrently) as the function block 112 is being configured to perform the first operation, the configuration block 114 may write second configurable data corresponding to a second operation mode to a second nonvolatile storage device. In this case, after the first operation is performed by the function block 112, the configuration block 114 reads the second configurable data written to the second nonvolatile storage device, and configures the function block 112 to perform a second operation according to or based on the second configurable data.

According to at least this example embodiment, the second configurable data may be written to the second nonvolatile storage device of the configuration block 114 while the configuration block 114 is configuring the function block 112 to perform the first operation. Alternatively, the second configurable data may be written to the second nonvolatile storage device of the configuration block 114 while the function block 112 performing the first operation. In this case, the configuration block 114 reads the configurable data written to the first or second nonvolatile storage device of the configuration block 114 and outputs the read configurable data to the function block 112 to configure the function block 112.

When it is desired to sequentially perform the first operation and the second operation in the function block 112, the second configurable data may be written to the second nonvolatile storage device of the configuration block 114 between a time when the first configurable data read from the first nonvolatile storage device of the configuration block 114 is output to the function block 112 and a time when the function block 112 completes the first operation. Accordingly, the logic device 100 may have improved configuration/reconfiguration operating speeds.

In addition, the function block 112 may be reconfigured to more rapidly to perform the second operation after performing the first operation. Thus, the logic device 100 may be implemented to have a runtime reconfiguration logic (RRL).

Although a case where the function block 112 performs the first operation while the second configurable data is simultaneously and/or concurrently written to the second nonvolatile storage device of the configuration block 114 is described above, example embodiments are not limited thereto. For example, according to at least one other example embodiment, and based on implementation, the second configurable data may be written to the second nonvolatile storage device of the configuration block 114 after the function block 112 performs the first operation and a given, desired or predetermined time elapses. In this case, the given, desired or predetermined time may be determined according to a time when the second operation is to be initiated in the logic device 100.

In this manner, the configuration block 114 may configure the function block 112 by using at least two nonvolatile storage devices so that the function block 112 may perform operations corresponding to a plurality of operation modes. An example case in which the configuration block 114 has an overlay configuration is described with reference to FIG. 4A.

In a case where the configuration block 114 has a multi configuration, the configuration block 114 configures the function block 112 based on configurable data written to each of the nonvolatile storage devices, which corresponds to each of a plurality of operation modes, so that the function block 112 may perform an operation corresponding to any one of the plurality of operation modes. In more detail, the configuration block 114 may write configurable data corresponding to each of the plurality of operation modes to a corresponding nonvolatile storage device, such that each nonvolatile storage device stores configurable data corresponding to an operation mode.

Unlike the case where the configuration block 114 has an overlay configuration, when the configuration block 114 is of the multi configuration type, configurable data may be previously written to each of the nonvolatile storage devices of the configuration block 114. In this case, configurable data may be written to a nonvolatile storage device when configuring or reconfiguring the logic device 100 so that operations corresponding to a plurality of operation modes may be performed in the logic device 100 according to a function desired by a user. However, example embodiments are not limited thereto. An example case where the configuration block 114 is implemented in the multi configuration type is described with reference to FIG. 4B.

For example, in the case where the configuration block 114 has an overlay configuration, when it is desired to have the function block 112 perform a particular operation, the configuration block 114 reads configurable data stored in the first nonvolatile memory 120 and writes the configurable data to a nonvolatile storage device of the configuration block 114. The configuration block 114 then outputs the written configurable data to the function block 112 to configure the function block 112 to perform the particular operation. In this example configuration, the function block 112 is configured to perform the operation at a given, desired or predetermined time when it is desired to perform a given, desired or predetermined operation in the function block 112.

In the case where the configuration block 114 has a multi configuration, configurable data corresponding to a plurality of operation modes is written to nonvolatile storage devices of the configuration block 114 regardless (or independent) of the time when it is desired to have the function block 112 perform a particular operation. Accordingly, at a time when it is desired to have the function block 112 perform the operation, the configuration block 114 outputs configurable data from a nonvolatile storage device to the function block 112 to configure the function block 112.

According to at least this example embodiment, if the configuration block 114 has an overlay configuration, then the logic device 100 may be configured so that operations corresponding to a plurality of operation modes may be performed by using a relatively small number of nonvolatile storage devices. If the configuration block 114 has a multi configuration, then the logic device 100 may be configured so that operations corresponding to a plurality of operation modes may be performed by using a plurality of nonvolatile storage devices, which correspond to the plurality of operation modes.

If the configuration block 114 has an overlay configuration, then the logic device 100 may include the first nonvolatile memory 120, unlike the case where the configuration block 114 has a multi configuration. However, when the configuration block 114 has an overlay configuration, the logic device 100 may be configured so that operations corresponding to a plurality of operation modes may be performed by using a smaller number of nonvolatile storage devices as compared to the case where the configuration block 114 has a multi configuration. In addition, if the configuration block 114 has a multi configuration, then a number of nonvolatile storage devices may correspond to the number of a plurality of operation modes, unlike the case where the configuration block 114 has an overlay configuration.

Moreover, in the multi configuration case, since configurable data has already been written to the nonvolatile storage devices of the configuration block 114, the logic device 100 may be more rapidly configured compared to the case where the configuration block 114 has an overlay configuration. The first nonvolatile memory 120 stores configurable data for configuring the logic block 110 so that operations corresponding to a plurality of operation modes may be performed. If the plurality of operation modes includes first through n-th operation modes, then the configurable data includes first through n-th configurable data for performing operations corresponding to the first through n-th operation modes, respectively.

In FIG. 1, for convenience of explanation, the case where the logic device 100 includes the first nonvolatile memory 120 is illustrated. If the configuration block 114 has a multi configuration, then the logic device 100 may not include the first nonvolatile memory 120 for storing configurable data.

Still referring to FIG. 1, the controller 130 controls the overall operation of the logic device 100. For example, the controller 130 controls the first nonvolatile memory 120 and/or the configuration block 114 so that the function block 112 may be configured to perform an operation corresponding to any one of a plurality of operation modes.

In more detail, for example, the controller 130 controls the configuration block 114 to configure the function block 112 to perform a first operation corresponding to a first operation mode from among a plurality of operation modes, and also controls the configuration block 114 to configure the function block 112 to perform a second operation corresponding to a second operation mode from among a plurality of operation modes with a given, desired or predetermined clock frequency. The given, desired or predetermined clock frequency may be a first or second clock frequency of the logic device 100, but example embodiments are not limited thereto. An example of this operation will be described below with reference to FIGS. 4A and 4B.

Because the logic device 100 may perform each of a plurality of operations by using the single function block 112, which may be configured to perform the plurality of operations, the area of the logic device 100 may be reduced.

In addition, because the configuration block 114 writes configurable data to a nonvolatile storage device to configure the function block 112, power consumption of the logic device 100 may be reduced. In more detail, since configurable data written to a nonvolatile storage device may be maintained even when power is not supplied to the logic device 100, a time required to load data from another nonvolatile memory (not shown) outside of the logic device 100 and/or power consumption may be reduced as power is supplied to the logic device 100.

Additionally, if the first nonvolatile memory 120 storing configurable data is included in the logic device 110, then a time required to load data from another nonvolatile memory (not shown) outside of the logic device 100 and/or power consumption may be reduced as power is supplied to the logic device 100 because data stored in the first nonvolatile memory 120 may be maintained even when power is not supplied to the logic device 100.

Accordingly, the logic device 100 using nonvolatile devices may be implemented in the form of a logic application, and thus, may be applied to various codecs, data processing devices, and filters. Thus, relatively low power and/or relatively low cost nonvolatile reconfiguration filters, codecs, and data processing devices may be implemented using the logic device 100 according to example embodiments.

Figure 2:
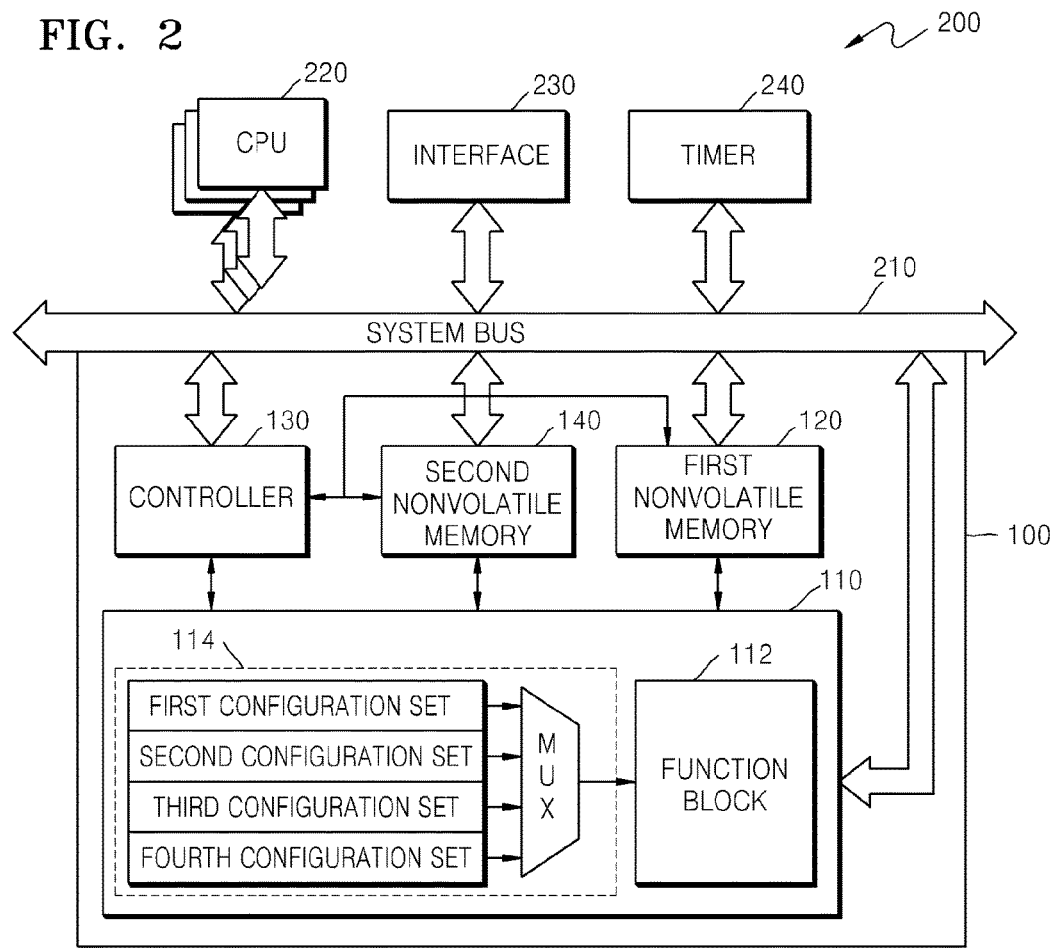
FIG. 2 is a block diagram illustrating an example embodiment of a system including the logic device of FIG. 1.

FIG. 2 is a block diagram illustrating a system 200 including a logic device 100 according to an example embodiment.

Referring to FIG. 2, the system 200 includes the logic device 100, a system bus 210, a plurality of central processing units (CPUs) 220, an interface 230, and a timer 240. The logic device 100 is similar to the logic device 100 shown in FIG. 1, but further includes a second nonvolatile memory 140. FIG. 2 also illustrates an example embodiment of the configuration block 114 in more detail than in FIG. 1. As discussed below, the second nonvolatile memory 140 may store data that is generated during operation of the logic device 100 or the system 200. The logic block 110 includes the function block 112 and the configuration block 114.

Although FIG. 2 shows a plurality of central processing units 220, the example embodiment may include one or more central processing units including one or more processing cores.

Only components related to the example embodiment shown in FIG. 2 are illustrated in FIG. 2. It will be understood by those of ordinary skill in the art that components other than those illustrated in FIG. 2 may also be included in the system 200. The logic device 100 is not limited to the configuration illustrated in FIG. 2. Since at least some of the above description of the logic device 100 illustrated in FIG. 1 is applicable to the logic device 100 illustrated FIG. 2, a repeated description is omitted.

The system 200 may be implemented in a form of a system on chip (SOC), and for example, may be an advanced RISC machine (ARM)-based system. However, example embodiments are not limited thereto. In addition, the system 200 may be implemented in a form of an RRL.

The logic device 100 may perform a given, desired or predefined function of a plurality of functions by using the logic block 110, the first nonvolatile memory 120, the controller 130, and the second nonvolatile memory 140. The given, desired or predetermined function may include operations corresponding to a plurality of operation modes.

The logic block 110 includes the function block 112 and the configuration block 114. The function block 112 may be configured to perform operations corresponding to a plurality of operation modes. The configuration block 114 may configure the function block 112 to perform the operations corresponding to the plurality of operation modes.

An example embodiment in which the function block 112 may be configured to perform operations corresponding to first through fourth operation modes is conceptually described below with reference to FIG. 2. In this example embodiment, the configuration block 114 configures the function block 112 according to a configuration set selected by a multiplexer MUX from among first through fourth configuration sets. Thus, the function block 112 may perform an operation based on an operation mode corresponding to a configuration set from among the first through fourth configuration sets.

In this manner, the logic block 100 is implemented so that hardware resources (e.g., limited hardware resources) may be reconfigured, and thus, the area of the system 200 may be reduced.

Still referring to FIG. 2, the first nonvolatile memory 120 stores configurable data for configuring the function block 112 according to one or more of the plurality of operation modes.

The controller 130 controls the first nonvolatile memory 120 and the configuration block 114 to configure the function block 112 to perform operations corresponding to one or more of a plurality of operation modes. In addition, the controller 130 may control the second nonvolatile memory 140, and the second nonvolatile memory 140 may store data that is generated during operation of the logic device 100 or the system 200.

The controller 130 controls a mode of the logic device 100 so that the logic device 100 may perform a given, desired or predefined function of a plurality of functions. For example, the logic device 100 may operate in a test mode, a switching mode, an operation mode, etc. However, example embodiments are not limited thereto.

The test mode may be a bitstream verification mode or a memory state control mode.

The switching mode may be a mode for switching a runtime configuration so that operations corresponding to the plurality of operation modes may be performed by the logic device 100.

The operation mode may be a mode for performing a given, desired or predetermined operation setting in the function block 112 of the logic device 100. According to at least some example embodiments, the logic device 100 may be in the switching mode and the operation mode simultaneously and/or concurrently. However, example embodiments are not limited thereto.

The system bus 210 transmits and/or receives data to and/or from the logic device 100, the plurality of central processing units 220, the interface 230, and the timer 240. The system bus 210 may include an advanced microcontroller bus architecture (AMBA) interface. However, example embodiments are not limited thereto. The AMBA interface enables the logic device 100 to be connected to the system bus 210, which may allow for a more flexible system configuration.

The plurality of central processing units 220 control the overall function of the system 200. Each of the plurality of central processing units 220 may be an ARM processor, however, example embodiments are not limited thereto.

The interface 230 may include a communication interface for transmitting and receiving data to and from an external device (not shown), and a user interface for receiving input information from a user or outputting output information.

The timer 240 monitors operations of the system 200 and detects abnormal operation of the system 200. For example, the timer 240 may be a watchdog timer. However, example embodiments are not limited thereto.

In one example, the system 200 may be implemented in a form of a nonvolatile reconfigurable SOC.

Figure 3:
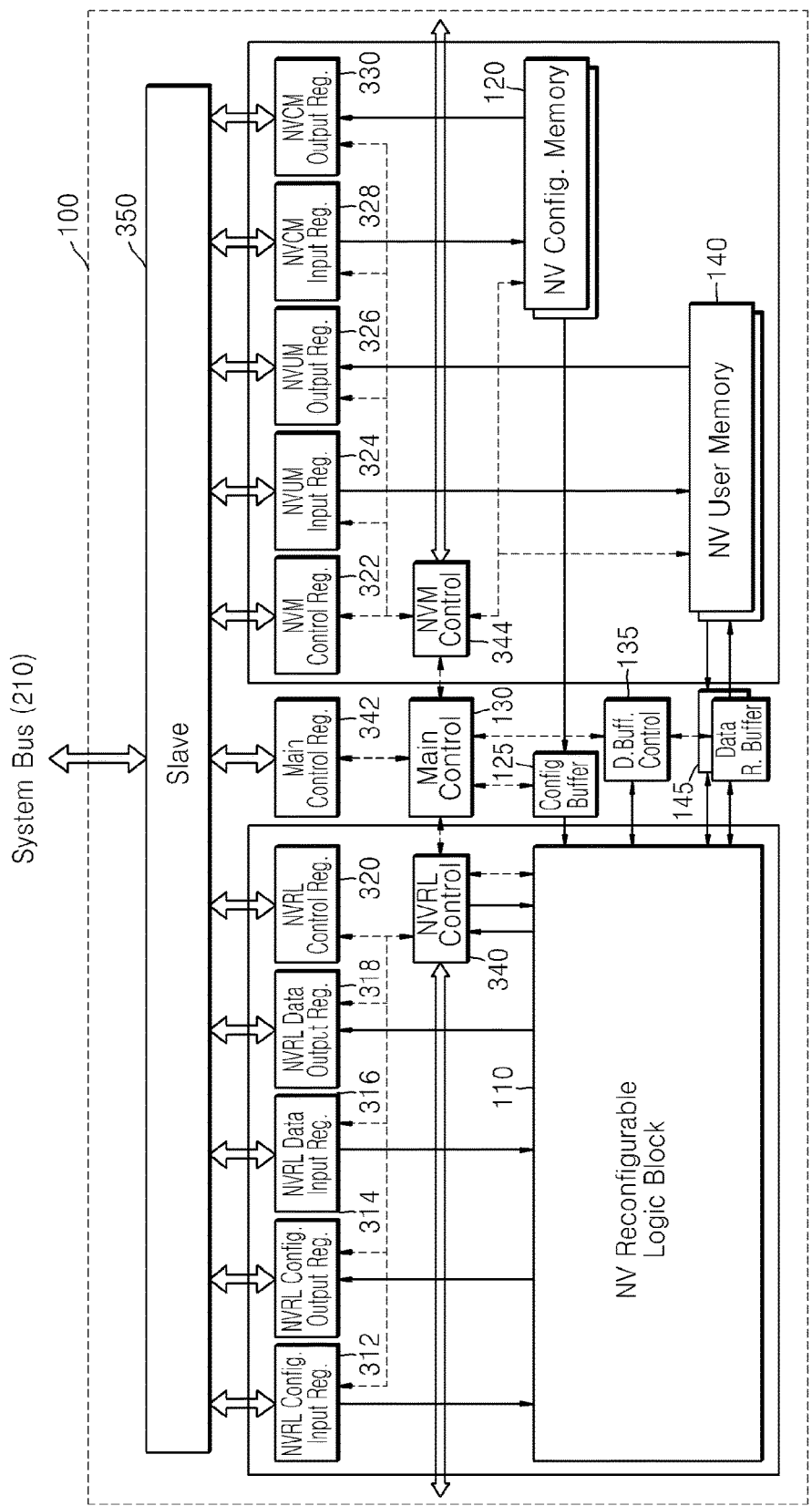
FIG. 3 is a block diagram of a logic device according to another example embodiment.

FIG. 3 is a block diagram of a logic device according to another example embodiment.

Referring to FIG. 3, the logic device 100 includes: a logic block 110, a first nonvolatile memory 120, a controller 130 and a second nonvolatile memory 140. The logic block 110 may be implemented as a nonvolatile (NV) reconfigurable logic module. The first nonvolatile memory 120 may be configured as a nonvolatile (NV) configuration memory. The controller 130 may be implemented as a main control module. The second nonvolatile memory 140 may be implemented as a nonvolatile (NV) user memory. However, example embodiments are not limited to these example implementations.

The logic block 110 is connected to a slave 350 through a plurality of registers 312, 314, 316, and 318. A nonvolatile reconfigurable logic (NVRL) control module 340 is connected to the controller 130, and controls the logic block 110. In this case, the NVRL control module 340 is connected to the slave 350 through a NVRL control register module 320. In addition, the logic block 110 transmits and receives data to and from the controller 130 through a buffer control module 135.

Still referring to FIG. 3, the first nonvolatile memory 120 is connected to the slave 350 through registers 328 and 330. In this example, the register 328 is a nonvolatile configuration memory input register, and the register 330 is a nonvolatile configuration memory output register. The second nonvolatile memory 140 is connected to the slave 350 through registers 324 and 326. In this example, the register 324 is a nonvolatile user memory input register, and the register 326 is a nonvolatile user memory output register.

In the example embodiment shown in FIG. 3, the first nonvolatile memory 120 is a nonvolatile configuration memory, and the second nonvolatile memory 140 is a nonvolatile user memory.

The first and second nonvolatile memories 120 and 140 are controlled via a nonvolatile memory (NVM) control module 344 connected to the controller 130. The NVM control module 344 is connected to the slave 350 through an NVM control register 322. In the example embodiment shown in FIG. 3, the register 322 is a nonvolatile memory control register.

In addition, the first nonvolatile memory 120 transmits and receives data to and from the logic block 110 through a configuration buffer 125. The second nonvolatile memory 140 transmits and receives data to and from the logic block 110 through a data R. buffer 145.

The controller 130 is connected to the slave 350 through a main control register 342. The controller 130 controls the configuration buffer 125, the buffer control module 135, and the data R. buffer 145.

The slave 350 is connected to the system bus 210, which is described above with regard to FIG. 2. The slave 350 may be a 135 bit advanced high-performance bus (AHB) slave or a 98 bit advanced peripheral bus (APB) slave. However, example embodiments are not limited thereto, and the slave 350 may be an advanced system bus (ASB) slave.

Figure 4A:
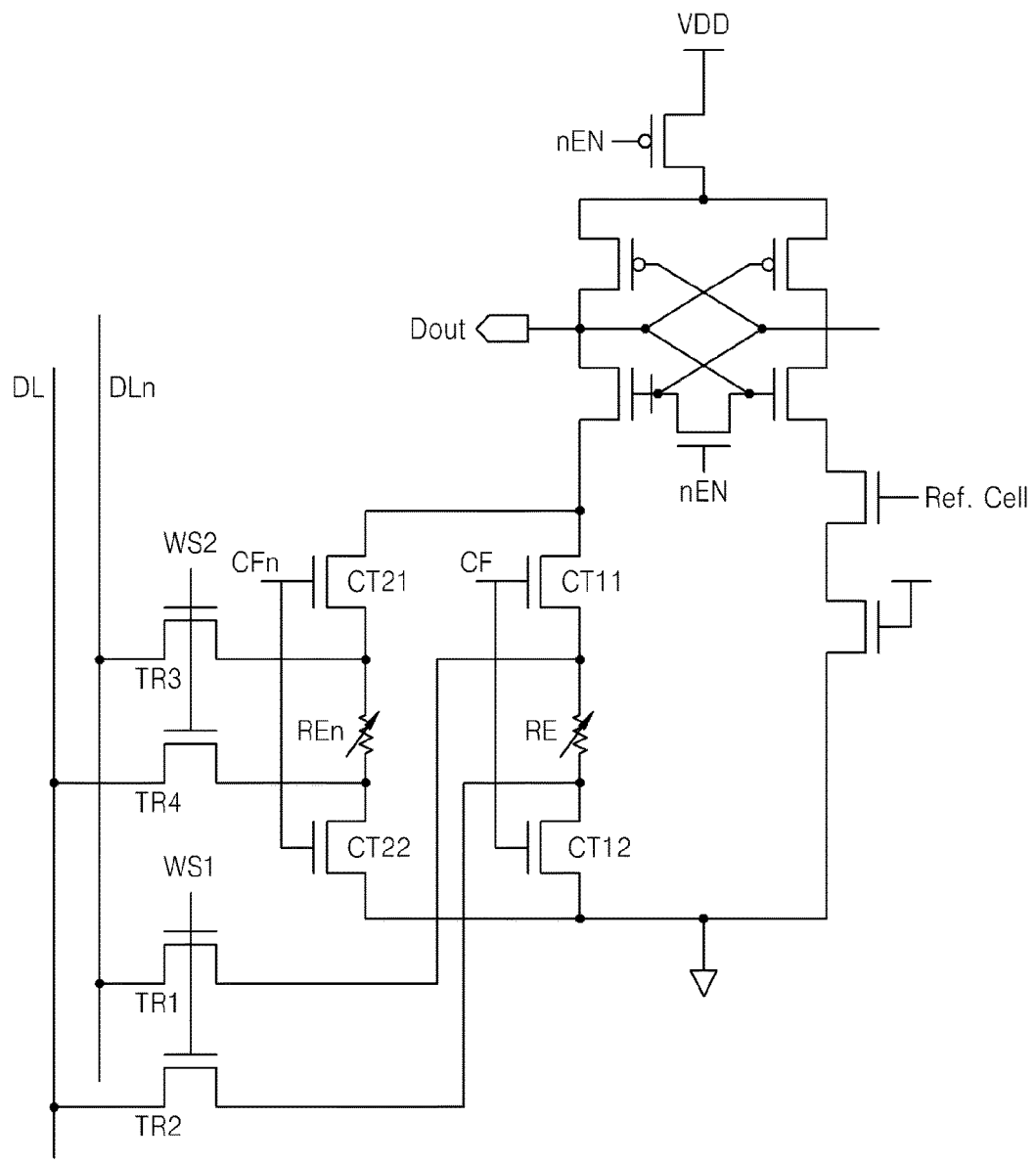
FIGS. 4A and 4B are circuit diagrams each illustrating an example embodiment of the configuration block of FIG. 1.
Figure 4B:
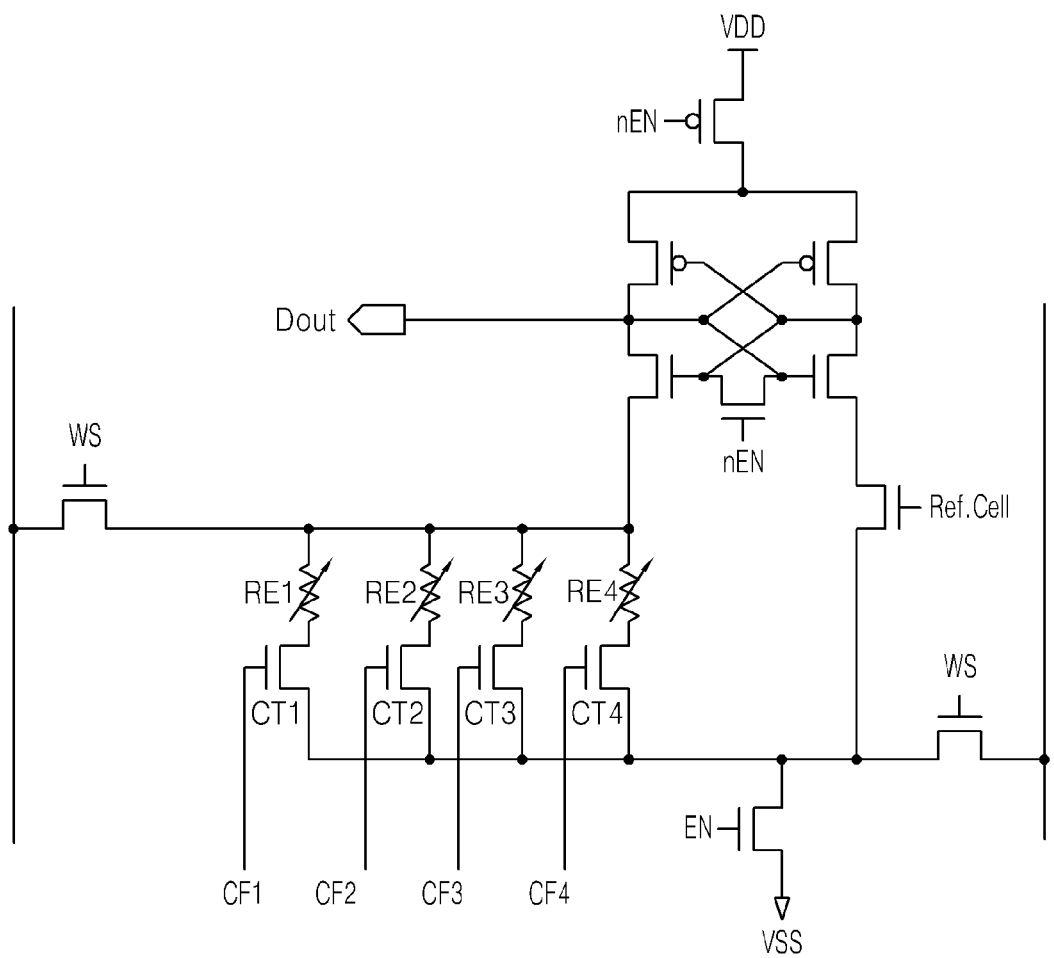

FIGS. 4A and 4B are circuit diagrams each illustrating a latch as an example of the configuration block 114 of FIG. 1. In more detail, FIG. 4A indicates a case where the configuration block 114 has an overlay configuration, and FIG. 4B indicates a case where the configuration block 114 has a multi configuration.

Referring to FIGS. 1 and 4A, the configuration block 114 is a nonvolatile latch having an overlay configuration, but is not limited thereto. In addition, although FIG. 4A illustrates a case where two nonvolatile storage devices RE and REn are included in the latch, the latch may include one nonvolatile storage device or three or more nonvolatile storage devices according to implementation and/or usage environment, and thus, may further include a plurality of transistors.

The latch may perform a read operation for reading data stored in each of the first and second nonvolatile storage devices RE and REn. The latch may also perform an output operation for outputting the read data through an output terminal Dout.

The latch may also perform a write operation for writing data, which is input through data lines DL and DLn, to the first and second nonvolatile storage devices RE and REn. In one example, data input through the data lines DL and DLn may be loaded from the first nonvolatile memory 120, and the input data may be written to any one of the first and second nonvolatile storage devices RE and REn according to switching operations of first through fourth switching devices TR1, TR2, TR3, and TR4. In this case, the first through fourth switching devices TR1, TR2, TR3, and TR4 are transistors.

In addition, the configuration block 114 includes fifth and sixth transistors CT11 and CT12, which are connected to respective ends of the first nonvolatile storage device RE, and seventh and eighth transistors CT21 and CT22, which are connected to respective ends of the second nonvolatile storage device REn.

Each of the first and second nonvolatile storage devices RE and REn may be implemented with a variable resistor device that may be a high resistance state or a low resistance state according to a comparison with a reference cell Ref. Cell. However, example embodiments are not limited thereto.

Example operation of the latch of FIG. 4A is described below with reference to FIGS. 5A and 5B.

Figure 5A:
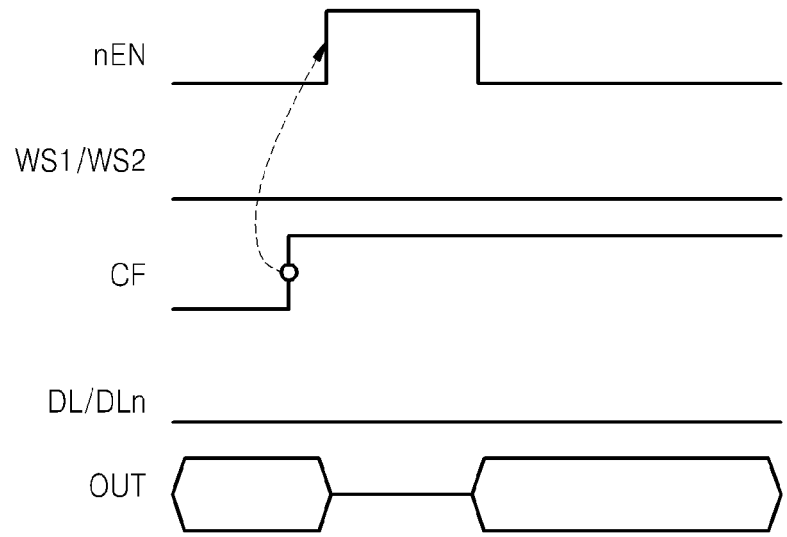
FIGS. 5A and 5B are timing diagrams illustrating example operation of the configuration block of FIG. 4A.
Figure 5B:
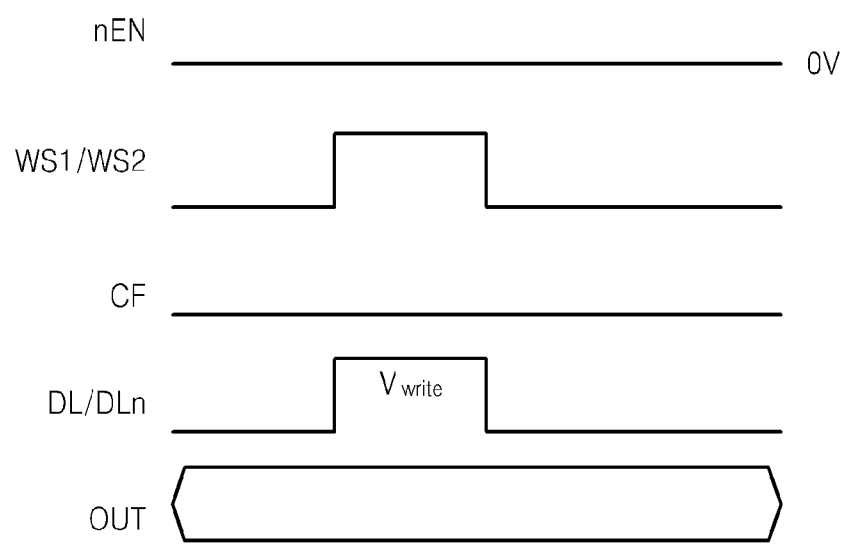

FIGS. 5A and 5B are timing diagrams illustrating example operation of the latch of FIG. 4A. In more detail, FIG. 5A is a timing diagram illustrating example operation of the latch in a read mode, and FIG. 5B is a timing diagram illustrating example operation of the latch in a write mode.

Referring to FIGS. 1, 4A, and 5A, the timing diagram of FIG. 5A illustrates example operation of the latch during a read operation for reading data written to the first nonvolatile storage device RE. When it is desired to read data written to the nonvolatile storage device RE, a control signal CF that is output from the controller 130 changes from a deactivated state to an activated state at a positive edge thereof. When a positive edge of the control signal CF is generated, an enable signal nEN is activated, and data written to the first nonvolatile storage device RE is read. The read data is then output through an output terminal Dout. In this example, the data output through the output terminal Dout is input to the function block 112, and the function block 112 is configured to perform an operation corresponding to an operation mode based on the data output through the output terminal Dout.

While performing the read operation, first and second switching control signals WS1 and WS2 for controlling switching operations of the first through fourth transistors TR1, TR2, TR3, and TR4 are deactivated, and a signal that is input through the data lines DL and DLn does not exist or is deactivated.

FIG. 5B is a timing diagram illustrating example operation of the latch according to a write operation for writing data to the first nonvolatile storage device RE.

Referring to FIGS. 1, 4A, and 5B, data that is input through the data lines DL and DLn from the first nonvolatile memory 120 is written to any one of the first and second nonvolatile storage devices RE and REn in response to a control signal output from the controller 130. In this case, the control signal that is output from the controller 130 may be the first switching control signal WS1 or the second switching control signal WS2 that controls at least one of the switching devices TR1, TR2, TR3, and TR4. The switching device TR1 is connected between the data line DLn and a terminal of the nonvolatile storage device RE, the switching device TR2 is connected between the data line DL and another terminal of the nonvolatile storage device RE, the switching device TR3 is connected between the data line DLn and a terminal of the nonvolatile storage device REn, and the switching device TR4 is connected between the data line DL and another terminal of the nonvolatile storage device REn.

When it is desired to write data input through the data lines DL and/or DLn to the first nonvolatile storage device RE, the enable signal nEN maintains a deactivated state and the first switching signal WS1 is activated. Accordingly, the data input through the data lines DL and/or DLn is written to the first nonvolatile storage device RE.

In more detail, switching operations of the first and second transistors TR1 and TR2 are controlled by the activated first switching control signal WS1, and thus, the data input through the data lines DL and/or DLn is written to the first nonvolatile storage device RE.

The data that is input through the data lines DL and DLn may be configurable data stored in the first nonvolatile memory 120 shown in FIG. 1, for example. Accordingly, as described above, configurable data input through the data lines DL and DLn may be written to any of the two nonvolatile storage devices RE and REn, the written configurable data may be read, and the read configurable data may be output to the function block 112. Accordingly, the function block 112 may perform an operation corresponding to an operation mode, which corresponds to the configurable data.

In addition, the control signal CF indicating the activation or deactivation of the first nonvolatile storage device RE controls switching operations of the fifth and sixth transistors CT11 and CT12 connected to respective ends of the first nonvolatile storage device RE, and a control signal CFn indicating the activation or deactivation of the second nonvolatile storage device REn controls switching operations of the seventh and eighth transistors CT21 and CT22 connected to respective ends of the second nonvolatile storage device REn. In this case, each of the plurality of transistors CT11, CT12, CT21, and CT22 serves as a switching device. However, example embodiments are not limited to this example.

As illustrated in the timing diagram of FIG. 5B, when the control signal CF indicating the activation or deactivation of the first nonvolatile storage device RE is deactivated, data is written to the first nonvolatile storage device RE. However, the example embodiments are not limited thereto. For example, when the control signal CF is activated, data may be written to the second nonvolatile storage device REn. In this case, the enable signal nEN is maintained (e.g., continuously remains) in a deactivated state and the second switching control signal WS2 is activated, and thus, data input through the data lines DL and DLn is written to the second nonvolatile storage device REn. However, example embodiments are not limited thereto. For example, an operation for writing data to the first nonvolatile storage device RE or the second nonvolatile storage device REn may be performed with reference to the control signal CFn indicating the activation or deactivation of the second nonvolatile storage device REn.

In this manner, the configuration block 114 may configure the function block 112 by using a latch including at least two nonvolatile storage devices so that the function block 112 may be configured to perform an operation corresponding to any of a plurality of operation modes.

As illustrated in FIGS. 5A and 5B, a write operation may be performed in a period in which the enable signal nEN is deactivated, whereas a read operation may be performed in a period in which the enable signal nEN is activated. Thus, when a read operation for any one of the two nonvolatile storage devices RE and REn is completed, a write operation for any one of the two nonvolatile storage devices RE and REn may be performed. Similarly, when a write operation for any one of the two nonvolatile storage devices RE and REn is completed, a read operation for any one of the two nonvolatile storage devices RE and REn may be performed.

In a logic device according to at least some example embodiments, a second configurable data may be written to the second nonvolatile storage device REn of the configuration block 114 between a time when a first configurable data read from the first nonvolatile storage device RE of the configuration block 114 is output to the function block 112 and a time when the function block 112 completes the first operation corresponding to the first configurable data, thereby improving speed of configuration and reconfiguration operations of logic devices.

However, if only one nonvolatile storage device is included in the configuration block 114, or if two or more nonvolatile storage devices are included in the configuration block 114, the second configurable data may be written to the first nonvolatile storage device RE rather than the second nonvolatile storage device REn according to implementation and/or usage environment.

The configuration block 114 discussed above is implemented in a form of a latch including nonvolatile storage devices, and thus, configuration or reconfiguration of the logic device 100 may be implemented in runtime.

In connection with FIGS. 5A and 5B, an activated signal may indicate a high level signal and a deactivated signal may indicate a low level signal. However, example embodiments are not limited to this example.

Referring back to FIG. 4B, the configuration block 114 may be a nonvolatile type latch having a multi configuration form. However, example embodiments are not limited thereto. In addition, although FIG. 4B shows four nonvolatile storage devices RE1, RE2, RE3, and RE4 included in the nonvolatile type latch, the nonvolatile type latch may include any number of nonvolatile storage devices, wherein the number of nonvolatile storage devices may correspond to the number of operation modes or more based on implementation and/or usage environment. Accordingly, the nonvolatile type latch may further include a plurality of transistors.

The nonvolatile type latch shown in FIG. 4B includes a first nonvolatile storage device RE1 to store first configurable data corresponding to a first operation mode, a second nonvolatile storage device RE2 to store second configurable data corresponding to a second operation mode, a third nonvolatile storage device RE3 to store third configurable data corresponding to a third operation mode, and a fourth nonvolatile storage device RE4 to store fourth configurable data corresponding to a fourth operation mode. The first through fourth nonvolatile storage devices RE1, RE2, RE3, and RE4 may be implemented with a variable resistor device that may be in a high resistance state or a low resistance state according to a comparison with a reference cell Ref. Cell. However, example embodiments are not limited thereto.

The nonvolatile type latch may perform a read operation for reading data stored in each of the first through fourth nonvolatile storage devices RE1, RE2, RE3, and RE4, and an output operation for outputting the read data through an output terminal Dout.

First through fourth transistors CT1, CT2, CT3, and CT4 are connected to the first through fourth nonvolatile storage devices RE1, RE2, RE3, and RE4, respectively.

If a read operation for reading data written to any one of the first through fourth nonvolatile storage devices RE1 through RE4 is performed, data written to any one of the first through fourth nonvolatile storage devices RE1 through RE4 is read according to switching operations of the first through fourth transistors CT1, CT2, CT3, and CT4 based on respective control signals CF1 through CF4 that are output from, for example, the controller 130. The read data is output through the output terminal Dout. In this example, as the data output through the output terminal Dout is input to the function block 112, the function block 112 is configured to perform an operation corresponding to the data output through the output terminal Dout. In this case, the controller 130 outputs at least one of the control signals CF1, CF2, CF3, and CF4 (e.g., control signal CF3 in this example), which causes output of configurable data to the function block 112. In one example, the nonvolatile type latch may output the third configurable data written to the third nonvolatile storage device RE3 to the function block 112 through the output terminal Dout to configure the function block 112 to perform an operation corresponding to the third operation mode. In this example, the nonvolatile type latch outputs the third configurable data written to the third nonvolatile storage device RE3 to the function block 112 through the output terminal Dout in response to the control signal CF3.

Example operation of the circuit illustrated in FIG. 4B will be understood by those of ordinary skill in the art with reference to the circuit illustrated in FIG. 4A, the timing diagrams illustrated in FIGS. 5A and 5B, and the descriptions thereof, and thus, a more detailed description of the operation of the circuit illustrated in FIG. 4B is omitted.

Because the configuration block 114 is a multi configuration type latch including nonvolatile storage devices as explained above, configuration and reconfiguration of the logic device 100 may be implemented in and/or at run time.

Figure 6:
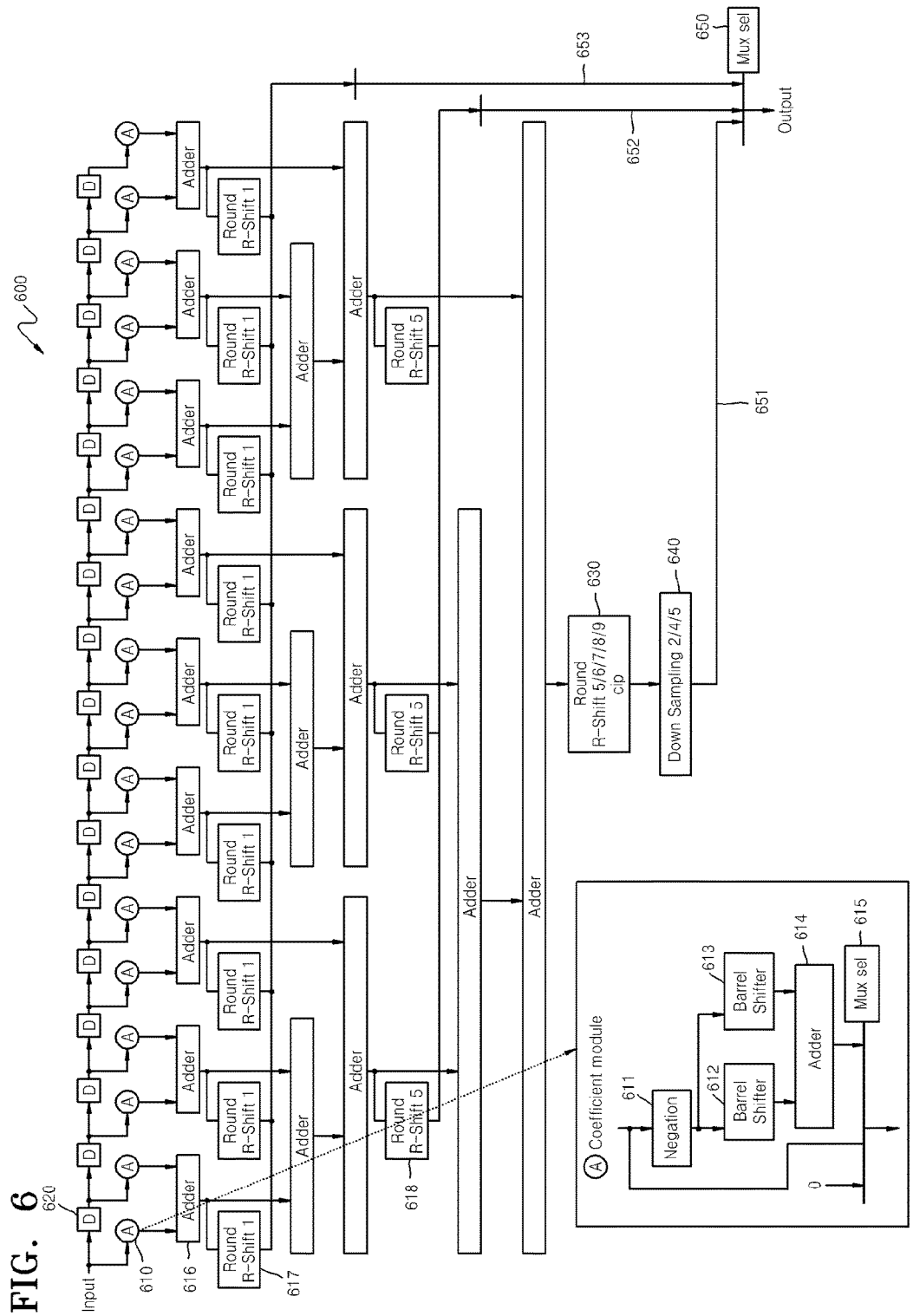
FIG. 6 is a diagram illustrating an example embodiment of a digital filter including the logic device of FIG. 1.

FIG. 6 is a diagram illustrating an example embodiment of a digital filter including the logic device of FIG. 1.

Referring to FIG. 6, the digital filter 600 includes a plurality of coefficient modules 610, a plurality of adders 616, a plurality of R-shift1s 617, a plurality of R-Shift5s, a R-shift 630, a down sampler 640, and a multiplexer 650. Each of the coefficient modules 610, the R-shift 630, the down sampler 640, and the multiplexer 650 may be implemented using one or more of the logic devices discussed above with regard to FIGS. 1-5B. In this example, the digital filter 600 includes one or more of the logic devices 100, which may be configured to perform operations corresponding to a plurality of operation modes based on a filter function.

The digital filter 600 shown in FIG. 6 is formed of eighteen taps, and may perform a plurality of operations based on a MPEG-4 format conversion filter, an H.264 half-pel interpolation, an H.264 quarter-pel interpolation, etc., according to a function defined in the one or more logic devices 100 included in the digital filter 600.

In example operation, input data 620 passes through the plurality of coefficient modules 610, the plurality of adders 616 and the plurality of round R-shifters 617, 618. An output is then selected by the multiplexer 650.

In the example embodiment shown in FIG. 6, a first output 651 may be an output of the MPEG-4 format conversion filter, a second output 652 may be an output of the H.264 half-pel interpolation, and a third output 653 may be an output of the H.264 quarter-pel interpolation. The first output 651 is output by the down sampler 640, the second output 652 is output after the plurality of R-Shift1s 617, and the third output 653 is output after a plurality of R-Shift5s Still referring to FIG. 6, each of the plurality of coefficient modules 610 generates coefficients of the digital filter 600. In the example embodiment shown in FIG. 6, each of the plurality of coefficient modules 610 includes a negation device 611, a plurality of barrel shifters 612 and 613, an adder 614, and a multiplexer 615. The adder 614 may be replaced by a multiplier in other example embodiments.

One or more logic devices according to one or more example embodiments may be included in one or more (e.g., each) of the negation device 611, the plurality of barrel shifters 612 and 613, and the multiplexer 615.

If, for example, the negation device 611 includes the logic device 100, then the logic device 100 may be configured or reconfigured to perform an operation corresponding to a first operation mode, in which the negation device 611 performs a negation operation, and a second operation mode in which the negation device 611 does not perform a negation operation. In this case, the function block 112 of the logic device 100 may be configured to perform a first operation corresponding to the first operation mode and a second operation corresponding to the second operation mode.

As another example, if the barrel shifters 612 and 613 include logic devices 100, then the logic devices 100 may be configured or reconfigured to perform operations corresponding to a plurality of operation modes indicating whether each of the barrel shifters 612 and 613 shifts a data word by a number of bits. In this case, the function block 112 of the logic device 100 may be configured to perform an operation corresponding to an operation mode for shifting a data word by any number of bits. For example, the function block 112 of the logic device 100 may be configured to perform a first operation corresponding to a first operation mode for shifting the data word by one bit, a second operation corresponding to a second operation mode for shifting the data word by two bits, . . . , an n-th operation corresponding to an n-th operation mode for shifting the data word by n bits (where n is a natural number that is greater than two).

As another example, if the multiplexer 615 includes the logic device 100, then the logic device 100 may be configured or reconfigured to perform operations corresponding to a plurality of operation modes in which the multiplexer 615 selects an output. In this case, the function block 112 of the logic device 100 may be configured to perform a first operation corresponding to a first operation mode for selecting logic "0", a second operation corresponding to a second operation mode for selecting input data as an output, and a third operation corresponding to a third operation mode for selecting an output of the adder 614.

Accordingly, each of the plurality of coefficient modules 610 may be configured or reconfigured in the manner as described above.

In this manner, as each of the shifter 630, the down sampler 640, and the multiplexer 650 is configured and/or reconfigured, the digital filter 600 may be implemented with a universal filter in which a plurality of filter functions are combined with each other.

Figure 7:
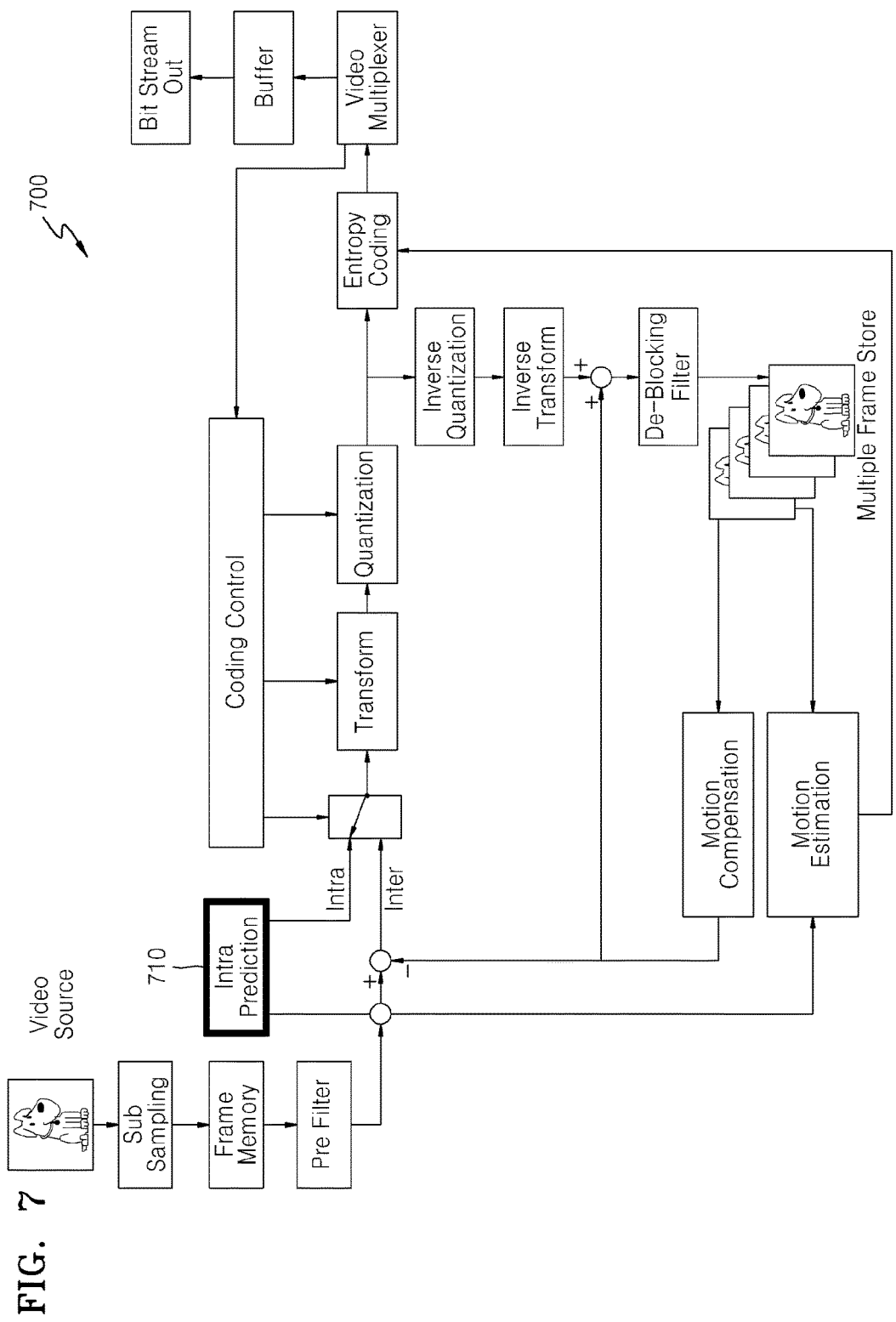
FIG. 7 is a diagram illustrating an example embodiment of a video codec including the digital filter of FIG. 6.

FIG. 7 is a diagram illustrating an example embodiment of a video codec including the digital filter 600. In this example, the video codec 700 performs an encoding operation based on the H.264 standard.

Referring to FIG. 7, the video codec 700 may perform operations corresponding to various functions by using a sub-sampling module, a frame memory, a pre-filter, an intra prediction module, a coding control module, a transform module, a quantization module, an inverse quantization module, an inverse transform module, an entropy coding module, a video multiplexer, a buffer, a bit stream output module, a motion compensation module, a motion estimation module, a multi frame store module, a deblocking filter, an adder, etc. Thus, the video codec 700 may output a video source in a bit stream form.

The video codec 700 may require many hardware resources due to various arithmetic operation modes. Because the video codec 700 includes the digital filter 600 with a runtime reconfigurable logic, various arithmetic operation modes may be effectively performed while reducing hardware costs.

For example, the video codec 700 shown in FIG. 7 includes an intra predictor 710, which performs an intra prediction operation according to an intra prediction mode of the video codec 700. In the example embodiment shown in FIG. 7, the intra predictor 710 may include the digital filter 600. The intra predictor 710 may perform a prediction operation by using the digital filter 600 configured to perform operations corresponding to a plurality of operation modes corresponding to a plurality of arithmetic operations according to a given, desired or predetermined intra prediction mode. In addition, the digital filter 600 may be configured so that the operations corresponding to the plurality of operation modes may be performed by using a plurality of logic devices 100.

In one example, the intra predictor 710 may perform nine arithmetic operations according to a 4×4 intra prediction mode, and the digital filter 600 may be configured or reconfigured to perform operations corresponding to a plurality of operation modes for performing the nine arithmetic operations. An example of nine operation modes corresponding to the nine arithmetic operations according to the 4×4 intra prediction mode is shown in Table 1.

TABLE 1

| Num | 4 × 4 Intra Prediction Mode |
|---|---|
| 0 | Vertical |
| 1 | Horizontal |
| 2 | Dc |
| 3 | diagonal_down_left |
| 4 | diagonal_down_right |
| 5 | vertical_right |
| 6 | horizontal_down |
| 7 | vertical_left |
| 8 | horizontal_up |

Thus, the digital filter 600 may be configured or reconfigured to perform operations corresponding to the nine operation modes that are defined to perform an intra prediction function and corresponds to the 4×4 intra prediction mode.

According to at least some example embodiments, the intra predictor 710 of the video codec 700 may perform four arithmetic operations according to a 16×16 intra prediction mode and may perform four arithmetic operations according to an 8×8 intra prediction mode. In each case, the digital filter 600 may be configured or reconfigured to operate according to each intra prediction mode.

A plurality of filters having a similar or substantially similar structure may be implemented in the video codec 700 by using the digital filter 600, thereby suppressing and/or preventing increases in power consumption and/or size.

Figure 8:
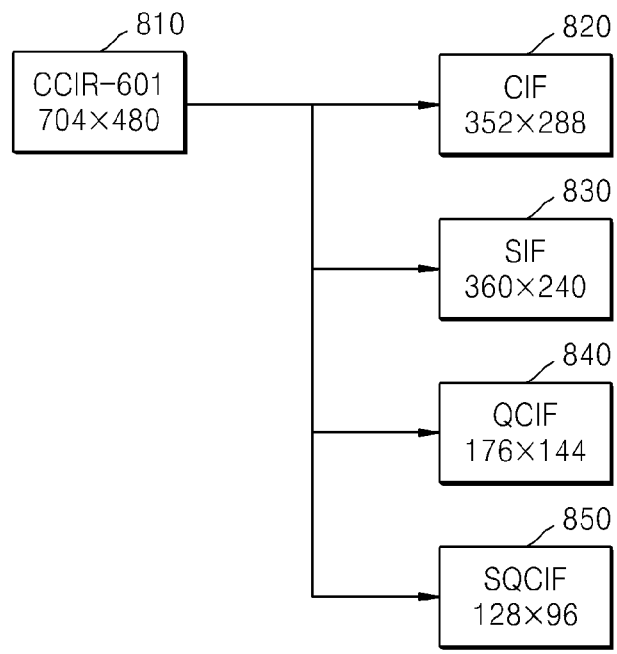
FIG. 8 is a diagram illustrating an example of various conversion operations of an example embodiment of a format conversion filter including the digital filter of FIG. 6.

FIG. 8 is a diagram illustrating an example of various conversion operations in a case where a format conversion filter includes the digital filter of FIG. 6. In this case, the format conversion filter is a MPEG-4 filter, but example embodiments are not limited thereto.

The format conversion filter may perform various video format conversion operations. Because the format conversion filter includes the digital filter 600 having a runtime reconfigurable logic, conversion modes may be performed more effectively while reducing hardware cost.

For example, the format conversion filter may perform various conversion operations, and the digital filter 600 may be configured or reconfigured to perform operations corresponding to a plurality of operation modes for performing the conversion operations. Example operation modes corresponding to various conversion operations according to the format conversion filter are shown in Table 2.

TABLE 2

| Factor | Tap no. | Filter taps | Divisor |
|---|---|---|---|
| A | ½ | 1 | 5, 11, 11, 5 | 32 |
| B | ½ | 1 | 2, 0, −4, −3, 5, 19, 26, 19, 5, −3, −4, 0, 2 | 64 |
| C | ¼ | 1 | −5, −4, 0, 5, 12, 19, 24, 26, 24, 19, 12, 5, 0, −4, −5 | 128 |
| D | 6/5 | 1 | −16, 22, 116, 22, −16 | 128 |
|  |  | 2 | −23, 40, 110, 1 | 128 |
|  |  | 3 | −24, 63, 100, −11 | 128 |
|  |  | 4 | −20, 84, 84, −20 | 128 |
|  |  | 5 | −11, 100, 60, −24 | 128 |
|  |  | 6 | 1, 110, 40, −23 | 128 |
| E | 3/5 | 1 | −24, −9, 88, 146, 88, −9, −24 | 256 |
|  |  | 2 | −28, 17, 118, 137, 53, −26, −15 | 256 |
|  |  | 3 | −15, −26, 53, 137, 118, 17, −28 | 256 |
| F | ½ | 1 | −12, 0, 140, 256, 140, 0, −12 | 512 |

Accordingly, the digital filter 600 may be configured and/or reconfigured to perform an operation according to each of operation modes corresponding to the various conversion operations. Thus, the digital filter 600 may be a universal filter in which the plurality of conversion operations described in Table 2 may be performed.

For example, when converting data defined by the CCIR-601 standard 810 to data defined by the CIF standard 820, first data (704×480) may be converted to second data (704×240) via a 1/2 decimation (vertical) operation, the second Data (704×240) may be converted to third data (352×240) via an operation of a B filter (1/2, horizontal), and the third data (352×240) may be converted to fourth data (352×288) via an operation of a D filter (6/5, vertical).

In this example, the first data defined by the CCIR-601 standard 810 may be converted to the fourth data defined by the CIF standard 820, and the three conversion operations explained above may be performed as the digital filter 600 according to at least this example embodiment is configured and/or reconfigured.

Example embodiments are not limited to the above example. The digital filter 600 may perform an operation for converting data defined by any one of the CCIR-601 standard 810, the CIF standard 820, the SIF standard 830, the QCIF standard 840, and the SQCIF standard 850 to data defined by another one of the CCIR-601 standard 810, the CIF standard 820, the SIF standard 830, the QCIF standard 840, and the SQCIF standard 850.

Logic devices according to example embodiments as illustrated in FIGS. 1 through 3 are not limited to digital filters and video codecs. Rather the logic devices may be included in modules for performing a communication according to a software defined radio (SDR). For example, the logic devices may be configured or reconfigured to implement 2G, 3G, 4G, GPS, and Wi-Fi based on a software defined radio (SDR).

Figure 9:
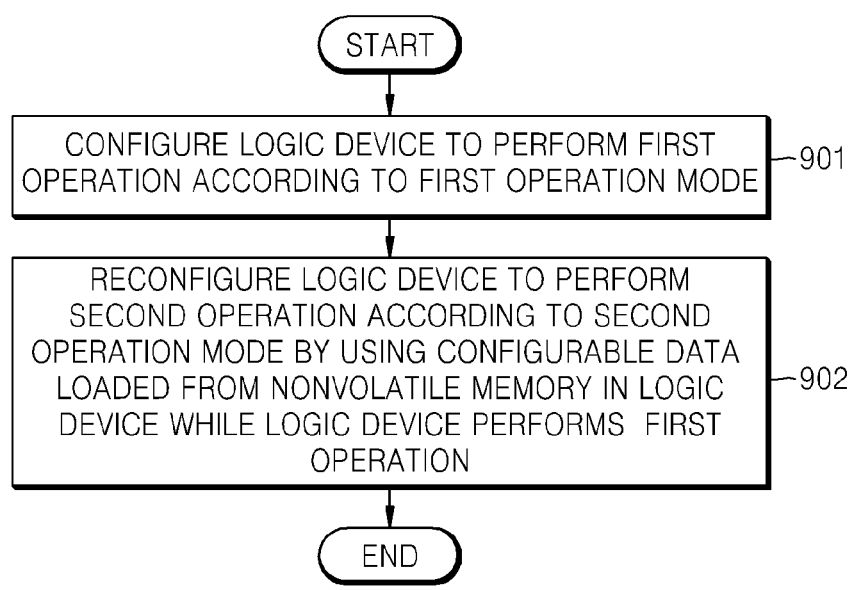
FIG. 9 is a flowchart illustrating a method of controlling a logic device according to an example embodiment.

FIG. 9 is a flowchart illustrating a method of controlling a logic device according to an example embodiment. The method shown in FIG. 9 will be described with regard to the logic device 100 for example purposes.

Referring to FIG. 9, the method of controlling the logic device 100 includes operations that are sequentially processed in logic devices illustrated in FIGS. 1 through 3. Thus, although omitted below, the contents described above with respect to the logic devices illustrated in FIGS. 1 through 3 may be included in the description of the method of FIG. 9. For example, the method of FIG. 9 may be applied to a case where the configuration block 114 has an overlay configuration. Thus, according to the flowchart of FIG. 9, the logic device 100 may be configured so that operations corresponding to a plurality of operation modes may be performed. As mentioned above, for example purposes, the method shown in FIG. 9 will be discussed with regard to the logic device 100 shown in FIG. 1.

Referring to FIG. 9, in operation 901 the controller 130 configures the logic device 100 to perform a first operation according to a first operation mode from among a plurality of operation modes.

In operation 902, the controller 130 reconfigures the logic device 100 to perform a second operation according to a second operation mode from among the plurality of operation modes by using configurable data loaded from the first nonvolatile memory 120 in the logic device 100 while the logic device 100 performs the first operation.

In one example, the controller 130 may reconfigure the logic device 100 by writing configurable data loaded from the first nonvolatile memory 120 to a nonvolatile storage device existing in the logic device 100 while the logic device 100 performs the first operation. In this case, the controller 130 may reconfigure the logic device 100 by using a latch including the nonvolatile storage device.

Thus, after the logic device 100 is configured to perform the first operation, the logic device 100 may be reconfigured to perform the second operation while performing the first operation. Accordingly, configuration and reconfiguration of the logic device 100 may be implemented in runtime, and the size of the logic device 100 may be reduced as a plurality of function blocks are integrated in a single function block.

In addition, because the logic device 100 uses the first nonvolatile memory 120 or the nonvolatile storage device, data stored in the first nonvolatile memory 120 or the nonvolatile storage device may be maintained even when no power is supplied to the logic device 100. Thus, power consumption of the logic device 100 may be reduced.

Example embodiments may be written as computer programs stored on tangible and/or a non-transitory computer readable recording mediums. The computer programs, when executed, cause the computer to perform the operations and/or functions discussed herein. In addition, the structure of data used in the above-described method may be recorded on a non-transitory computer readable recording medium by using various methods. Examples of the non-transitory computer readable recording medium include magnetic storage media (e.g., ROM, RAM, USB, floppy disks, hard disks, etc.), storage media such as optical recording media (e.g., CD-ROMs, or DVDs), and PC interface (e.g., PCI, PCI-express, WiFi, etc.)

Example embodiments discussed herein may be implemented in electric devices such as mobile phones, laptop computers, tablet computers, digital television (TV), etc.

Although example embodiments may be discussed herein as units, blocks, devices, etc., these elements may also be referred to as circuits. For example, the logic block 110 shown in FIG. 1 may alternatively be referred to as a logic circuit 110, the function block 112 may be referred to as a function circuit 112, the configuration block 114 may be referred to as the configuration circuit 114, etc.

It should be understood that the example embodiments described herein should be considered in a descriptive sense only and not for purposes of limitation. Descriptions of features or aspects within each embodiment should typically be considered as being available for other similar features or aspects in other embodiments.

What is claimed is:

1. A logic device comprising:
   a first nonvolatile memory;
   a second nonvolatile memory; and a logic circuit, both the first nonvolatile memory and the second nonvolatile memory external to the logic circuit, the logic circuit including,
a function circuit configurable to perform at least a first operation associated with a first operation mode and a second operation associated with a second operation mode; and
a configuration circuit including at least a first nonvolatile storage device and a second nonvolatile storage device, the configuration circuit configured to
configure the function circuit to perform the first operation, the configuring being based on reading first configuration data from the first nonvolatile storage device of the configuration circuit, the configuring including outputting the read first configuration data to the function circuit, the first configuration data associated with the first operation mode; and
write second configuration data from the first nonvolatile memory to the second nonvolatile storage device of the configuration circuit simultaneously with outputting the read first configuration data to the function circuit to configure the function circuit to perform the first operation to generate first data associated with the first configuration data and output the first data to the second nonvolatile memory, the second configuration data associated with the second operation mode,
wherein the configuration circuit includes
a latch configured to output, to the function circuit, the first configuration data stored in the first nonvolatile storage device,
the latch having an overlay configuration, the latch including
the first nonvolatile storage device and the second nonvolatile storage device,
first and second transistors separately coupling the first nonvolatile storage device to first and second data lines, respectively, the first and second transistors configured to be controlled by a common first switching signal,
third and fourth transistors separately coupling the second nonvolatile storage device to the first and second data lines, respectively, the third and fourth transistors configured to be controlled by a common second switching signal,
fifth and sixth transistors connected to respective ends of the first nonvolatile storage device, the fifth and sixth transistors configured to be controlled by a common first control signal associated with activation or deactivation of the first nonvolatile storage device, and
seventh and eighth transistors connected to respective ends of the second nonvolatile storage device, the seventh and eighth transistors configured to be controlled by a common second control signal associated with activation or deactivation of the second nonvolatile storage device.

2. The logic device of claim 1, wherein
the logic device further includes a controller configured to control the configuration circuit to configure the function circuit to perform the first operation associated with the first operation mode; and
the configuration circuit is configured to write the first configuration data to at least one of the first nonvolatile storage device and the second nonvolatile storage device in response to at least one switching signal of the common first switching signal or the common second switching signal being output from the controller.

3. The logic device of claim 2, wherein the controller is configured to output the common first switching signal or the common second switching signal according to the common first control signal or the common second control signal, respectively, the common first control signal indicative of activation or deactivation of the first nonvolatile storage device, the common second control signal indicative of activation or deactivation of the second nonvolatile storage device.

4. The logic device of claim 3, wherein the common first control signal indicative of the activation or deactivation of the first nonvolatile storage device controls a switching operation of at least one transistor of the first transistor or the second transistor, and
the common second control signal indicative of the activation or deactivation of the second nonvolatile storage device controls a switching operation of at least one transistor of the third transistor or the fourth transistor.

5. The logic device of claim 1, wherein the configuration circuit includes a plurality of nonvolatile storage devices, and wherein the configuration circuit is configured to configure the function circuit based on configuration data stored in each of the plurality of nonvolatile storage devices, each of the plurality of nonvolatile storage devices corresponding to an operation mode among the first operation mode and the second operation mode.

6. A digital filter comprising:
the logic device of claim 1; wherein
the first operation mode and the second operation mode are associated with a filter function.

7. The digital filter of claim 6, further comprising:
a plurality of shifters, at least one of the plurality of shifters including a separate logic device that is configurable to shift a data word by a first bit number corresponding to each operation mode of the first operation mode and the second operation mode.

8. A format conversion filter configured to convert a format of input data using the digital filter of claim 6.

9. A video codec for performing an encoding operation, the video codec comprising:
a plurality of logic devices, each logic device of the plurality of logic devices including,
a first nonvolatile memory;
a second nonvolatile memory;
a logic circuit, both the first nonvolatile memory and the second nonvolatile memory external to the logic circuit, the logic circuit including,
a function circuit configurable to perform a plurality of arithmetic operations associated with an intra prediction mode, and
a configuration circuit including at least a first nonvolatile storage device and a second nonvolatile storage device, the configuration circuit is configured to
configure the function circuit to perform a first arithmetic operation of the plurality of arithmetic operations, the configuring being based on reading first configuration data from the first nonvolatile storage device of the configuration circuit, the configuring including outputting the read first configuration data to the function circuit, the first configuration data associated with the first arithmetic operation, and
write second configuration data from the first nonvolatile memory to the second nonvolatile storage device of the configuration circuit simultaneously with outputting the read first configuration data to the function circuit to configure the function circuit to perform the first arithmetic operation to generate first data associated with the first configuration data and output the first data to the second nonvolatile memory, the second configuration data associated with a second arithmetic operation of the plurality of arithmetic operations,
wherein the configuration circuit includes
a latch configured to output, to the function circuit, the first configuration data stored in the first nonvolatile storage device
the latch having an overlay configuration, the latch including
the first nonvolatile storage device and the second nonvolatile storage device,
first and second transistors separately coupling the first nonvolatile storage device to first and second data lines, respectively, the first and second transistors configured to be controlled by a common first switching signal,
third and fourth transistors separately coupling the second nonvolatile storage device to the first and second data lines, respectively, the third and fourth transistors configured to be controlled by a common second switching signal,
fifth and sixth transistors connected to respective ends of the first nonvolatile storage device, the fifth and sixth transistors configured to be controlled by a common first control signal associated with activation or deactivation of the first nonvolatile storage device, and
seventh and eighth transistors connected to respective ends of the second nonvolatile storage device, the seventh and eighth transistors configured to be controlled by a common second control signal associated with activation or deactivation of the second nonvolatile storage device;
a digital filter configurable to perform the plurality of arithmetic operations associated with the intra prediction mode using the plurality of logic devices; and
an intra predictor configured to perform a prediction operation using the digital filter.

10. The video codec of claim 9, wherein,
the first nonvolatile memory is configured to store the first configuration data;
the configuration circuit is configured to load the first configuration data from the first nonvolatile memory; and
the configuration circuit is further configured to write the first configuration data from the first nonvolatile memory to the first nonvolatile storage device.

11. The video codec of claim 9, wherein the configuration circuit includes a plurality of nonvolatile storage devices, and wherein the configuration circuit is configured to configure the function circuit based on configuration data written to each of the plurality of nonvolatile storage devices, each of the plurality of nonvolatile storage devices corresponding to an arithmetic operation.

12. A method of controlling a logic device that is configurable to perform operations corresponding to a plurality of operation modes, the method comprising:
operating a configuration circuit to configure the logic device to perform a first operation associated with a first operation mode from among the plurality of operation modes, the configuring being based on reading first configuration data from a first nonvolatile storage device of the configuration circuit of a logic circuit of the logic device, the configuring including outputting the read first configuration data to a function circuit of the logic circuit of the logic device, the first configuration data being associated with the first operation mode; and
writing second configuration data from a first nonvolatile memory that is external to the logic circuit to a second nonvolatile storage device of the configuration circuit of the logic circuit simultaneously with outputting the read first configuration data to the function circuit of the logic circuit to configure the function circuit of the logic circuit to perform the first operation to generate first data associated with the first configuration data and output the first data to a second nonvolatile memory that is external to the logic circuit, the second configuration data associated with a second operation mode,
wherein the configuration circuit includes a latch configured to output, to the function circuit, the first configuration data stored in the first nonvolatile storage device, the latch having an overlay configuration,
wherein the operating the configuration circuit includes
controlling first and second transistors connected to respective ends of the first nonvolatile storage device with a common first control signal associated with activation or deactivation of the first nonvolatile storage device to cause an enable signal to be activated and the first configuration data written to the first nonvolatile storage device to be read, and the read first configuration data to be output through an output terminal of the latch to the function circuit, and
controlling third and fourth transistors separately coupling the second nonvolatile storage device to first and second data lines, respectively, with a common first switching signal to write the second configuration data that is input through the first and second data lines to the second nonvolatile storage device.

13. The method of claim 12, further comprising:
writing second configuration data loaded from the first nonvolatile memory of the logic device to the second nonvolatile storage device in the logic circuit while outputting the read first configuration data to the function circuit to configure the function circuit to perform the first operation.

14. A non-transitory computer readable recording medium having recorded thereon a program that, when executed by a computing device, performs the method of claim 12.

15. The logic device of claim 1, wherein, to write the second configuration data to the second nonvolatile storage device while configuring the function circuit to perform the first operation, the configuration circuit is further configured to write the second configuration data from the first nonvolatile memory to the second nonvolatile storage device.

16. The video codec of claim 9, further comprising:
a controller configured to output the common first switching signal or the common second switching signal to a configuration circuit of at least one logic device of the plurality of logic devices, such that the configuration circuit of the at least one logic device writes the first configuration data to at least one nonvolatile storage device of the at least one logic device in response to the common first switching signal or the common second switching signal.

17. The video codec of claim 16, wherein the controller is configured to output the common first switching signal or the common second switching signal according to the common first control signal or the common second control signal, respectively, the common first control signal indicative of activation or deactivation of the first nonvolatile storage device, the common second control signal indicative of activation or deactivation of the second nonvolatile storage device.

* * * * *